US012399504B2

(12) United States Patent
Alagic et al.

(10) Patent No.: US 12,399,504 B2
(45) Date of Patent: Aug. 26, 2025

(54) BATTERY CHARGE STATE BASED MISSION ASSIGNMENT FOR AUTONOMOUS MOBILE ROBOTS

(71) Applicant: Amazon Technologies, Inc., Seattle, WA (US)

(72) Inventors: Fahrudin Alagic, Lynn, MA (US); John Enright, Bedford, MA (US); Stephen Charles Paschall, Acton, MS (US)

(73) Assignee: Amazon Technologies, Inc., Seattle, WA (US)

( * ) Notice: Subject to any disclaimer, the term of this patent is extended or adjusted under 35 U.S.C. 154(b) by 244 days.

(21) Appl. No.: 17/852,770

(22) Filed: Jun. 29, 2022

(65) Prior Publication Data

US 2024/0004403 A1   Jan. 4, 2024

(51) Int. Cl.
| | |
|---|---|
| *G01R 31/371* | (2019.01) |
| *G05D 1/00* | (2006.01) |
| *G05D 105/20* | (2024.01) |
| *G05D 107/70* | (2024.01) |
| *G06Q 10/08* | (2024.01) |

(52) U.S. Cl.
CPC ......... *G05D 1/0297* (2013.01); *G01R 31/371* (2019.01); *G05D 2105/20* (2024.01); *G05D 2107/70* (2024.01); *G06Q 10/08* (2013.01)

(58) Field of Classification Search
CPC ............. G05D 1/0297; G05D 2107/70; G05D 2105/20; G01R 31/371; G06Q 10/08
USPC .......................................................... 701/23
See application file for complete search history.

(56) References Cited

U.S. PATENT DOCUMENTS

| | | | |
|---|---|---|---|
| 2016/0273927 A1* | 9/2016 | Kitajima | G01C 21/3415 |
| 2018/0326583 A1* | 11/2018 | Baroudi | B25J 9/1661 |
| 2019/0317526 A1* | 10/2019 | Goldman | G05D 1/0297 |
| 2020/0064831 A1* | 2/2020 | Pedersen | G01C 21/26 |
| 2022/0121837 A1* | 4/2022 | Cesic | G05D 1/69 |
| 2022/0147059 A1* | 5/2022 | Borne-Pons | G06Q 10/0631 |
| 2022/0164747 A1* | 5/2022 | Shah | G06Q 10/20 |

FOREIGN PATENT DOCUMENTS

| | | | |
|---|---|---|---|
| CN | 113487197 A | * | 10/2021 |
| CN | 113655771 A | * | 11/2021 |

OTHER PUBLICATIONS

Ali Bolu, Adaptive Task Planning for Multi-Robot Smart Warehouse, Feb. 9, 2021, IEEE Access (Year: 2021).*

Lukas Polten, Scheduling automated guided vehicles in very narrow aisle warehouses, Jan. 23, 2020, Elsevier, Omega (Year: 2020).*

\* cited by examiner

*Primary Examiner* — Matthias S Weisfeld
(74) *Attorney, Agent, or Firm* — Eversheds Sutherland (US) LLP

(57) ABSTRACT

Disclosed are various embodiments for optimizing robot utilization in autonomous mobile robots by accounting for the battery charge state when assigning missions to be performed by the autonomous mobile robots in a material handling facility. In particular, mission data associated with one or more missions and robot data including a battery charge state associated with one or more robots can be analyzed to determine a robot mission assignment that accounts for battery state charge in order to maximize robot utilization and productivity of material handling tasks.

20 Claims, 7 Drawing Sheets

BATTERY CHARGE STATE BASED MISSION ASSIGNMENT FOR AUTONOMOUS MOBILE ROBOTS

BACKGROUND

At material handling facilities, various items, articles, products, or packages may be organized for shipment to other locations. A variety of tasks may be performed in various types of material handling facilities including, such as receiving shipments of new inventory, storing new inventory in storage locations, picking items from the inventory storage locations in response to receiving orders, grouping the picked items, packing the items, readying the packed items for shipment, and sorting the packed items according to a final destination. As packages containing, for example, inventory and/or pre-packaged customer orders are received at material handling facilities, the packages can be transported to various locations within the facility prior to delivery to another destination.

BRIEF DESCRIPTION OF THE DRAWINGS

Many aspects of the present disclosure can be better understood with reference to the following drawings. The components in the drawings are not necessarily to scale, with emphasis instead being placed upon clearly illustrating the principles of the disclosure. Moreover, in the drawings, like reference numerals designate corresponding parts throughout the several views.

DETAILED DESCRIPTION

Figure 1:
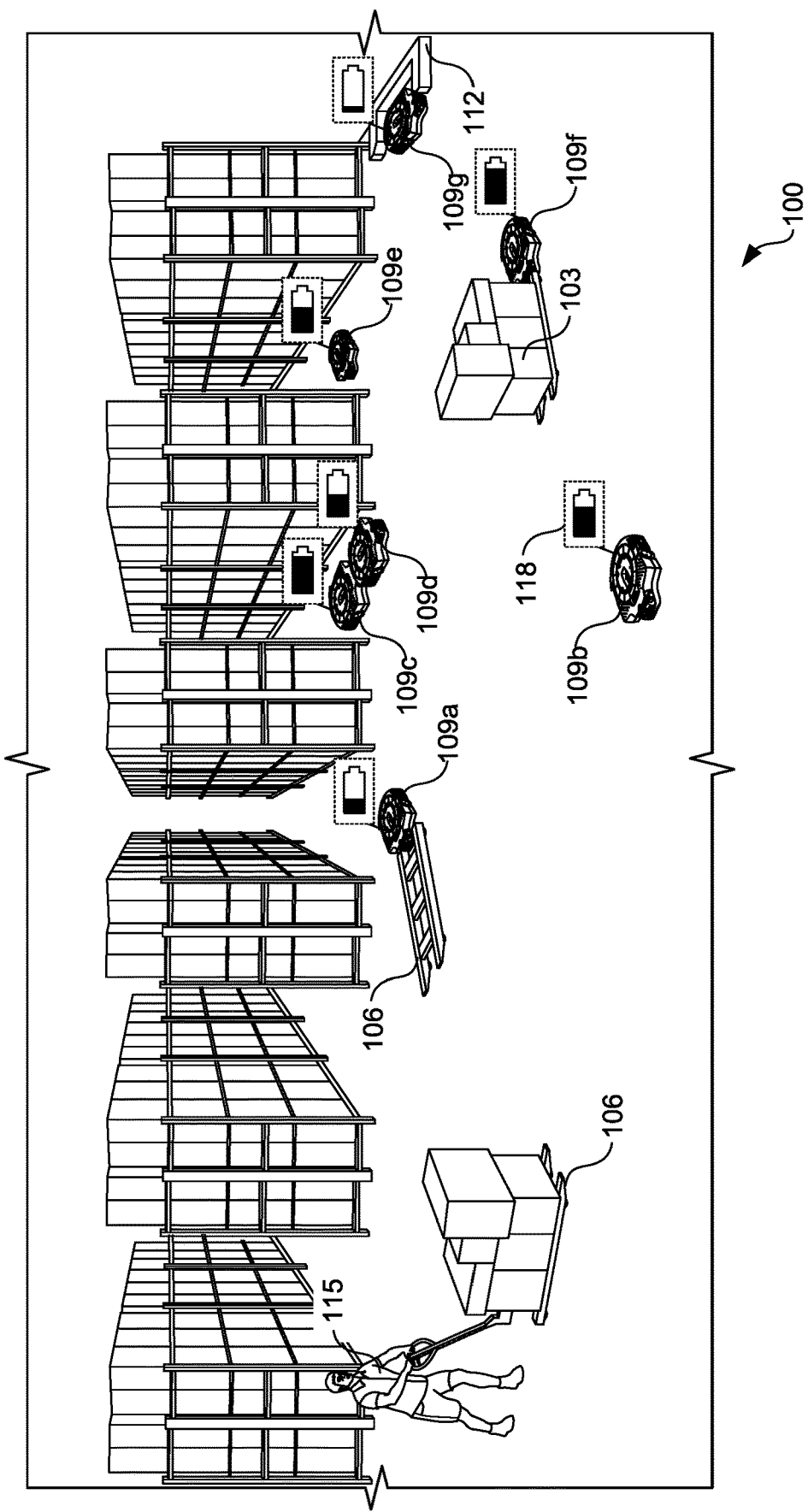
FIG. 1 illustrates an example material handling facility according to various aspects of the embodiments of the present disclosure.

Thousands of items, articles, or products can be stored at material handling facilities. These items can be stored at many different locations in the material handling facilities. It is necessary to transport the items from place to place within the material handling facilities, as items are consolidated for orders to ship and new items are introduced to the facilities for restocking. To that end, many different types of material handling equipment and systems, including conveyor systems, chutes, carts, robotic systems, and other equipment are often relied upon to facilitate the movement and transport of items within material handling facilities.

A number of different systems have been developed to help automate the transport, organization, and handling of items in a material handling facility or sort center. Conveyor systems, robotic automation machines, vacuum and gripping systems, and other systems have been designed to provide increased productivity through the automation of material handling tasks.

In the context outlined above, the present disclosure relates to optimizing robot utilization in autonomous mobile robots by accounting for the battery state of charge when assigning missions to be performed by the autonomous mobile robots in a material handling facility. A mission relates to assisting with one or more different tasks at various locations in material handling facilities. For example, a mission can correspond to the movement and transport of a given item, article, or product between different locations within a material handling facility. Given that the mission length can vary significantly (e.g., from about 30 feet to greater than 1000 feet), a robot's battery state of charge will limit which missions a particular autonomous robot is able to serve and complete before it needs to charge again. In order to maximize robot utilization (e.g., an amount of time a particular robot is in service vs. time spent charging) and potentially reduce the number of robots in a given fleet, it is beneficial to optimize robot mission assignments based at least in part on the battery state of charge data.

In various examples, missions may be performed in unstructured environments within material handling facilities. In an unstructured environment, an autonomous robot may face unexpected obstacles when navigating from one location to another location within a material handling facility and may be required to dynamically modify navigation to adapt to the various obstacles. For example, the autonomous robots may navigate in a human-collaborative environment outside of a structured environment causing unpredictability in the navigation of the autonomous mobile robot during a mission. When navigating in an unstructured environment, autonomous mobile robots continuously and autonomously acquire environmental information to support dynamic decision making during the performance of a mission. In various examples, the obstacles faced by the autonomous mobile robots during a mission may affect the speed and the overall mission time which may further deplete battery usage. As such, without accounting for the robot battery charge state and the unexpected obstacles may affect the battery usage, an autonomous mobile robot may run out of battery before completing a mission, thereby causing disruption in the overall productivity of material handling tasks.

In determining an optimal robot mission assignment, various assignment factors associated with both a given mission and a given autonomous robot can be considered. For example, the assignment factors can include a robot battery state of charge, a robot location, a mission location, a mission priority, a mission length, an estimated mission completion time, a load time, an unload time, a number of passing events, a number of stop events, a deceleration capability, a robot speed, a robot task capability, a robot task status, a robot battery health, and/or other factors. In some examples, one or more of the factors are included in the robot data obtained from autonomous robots available to perform missions within the facility and the mission data associated with unassigned missions. In some examples, one or more factors are calculated or estimated using the robot data, the mission data, historical and/or learned data associated with characteristics of the facility (e.g., areas of congestion, other known missions being performed, etc.), and/or other types of data. According to various examples, an assignment coordinator can analyze the various assignment factors to determine an optimal robot mission assignment for a given robot and a given mission. Upon determining a robot mission assignment, the given robot can be instructed to perform the given mission.

FIG. 1 illustrates an example material handling facility 100 according to various aspects of the embodiments. Among other material handling equipment and systems, the material handling facility 100 includes product inventory 103 (e.g., items, products, articles, packages, etc.) which may be stored or transported to various locations within the material handling facility 100, load handlers 106 (e.g., cart, pallet, container, etc.), autonomous mobile robots 109 (e.g., 109a, 109b, 109c, 109d, 109e, 109f, 109g) (also, "robot 109"), one or more charging stations 112, and/or other equipment and systems. In various examples, the load handlers 106 are not motorized or driven, however, and must be moved (e.g., pushed, pulled, etc.) manually by individuals 115 or by robotic systems. For example, the robots 109 may be capable of engaging with the load handlers 106 and/or other loads comprising product inventory 103 or other items and transporting the load handlers 106 or other loads to various locations in the material handling facility 100.

The material handling facility 100 is provided as an example environment or facility in which one or more robots 109 are implemented to automate material transport and handling tasks (e.g., missions). The material handling facility 100 may include several other automation tools and systems that are not shown in FIG. 1, such as conveyor systems, chutes, robotic arms and other automation systems, vacuum and gripping systems, and other systems. In practice, the robots 109 described herein can be implemented to assist with a number of different tasks at various locations in material handling facilities.

In various examples, as shown in FIG. 1, the material handling facility 100 may comprise an unstructured field environment in which robots 109 navigate through to perform various missions (e.g., assist with a number of different tasks at various locations in material handling facilities 100). For example, as shown in FIG. 1, the robots 109 may be required to navigate among individuals 115 and other robots 109 or obstacles while performing a mission.

FIG. 1 further illustrates the battery charge state 118 for the different robots 109. The battery charge state 118 for a given robot 109 corresponds to a level of charge of the battery relative to its capacity. As will be discussed in further detail, the battery charge state 118 can be used as a factor in determining which mission to assign to a given robot 109. In particular, by understanding the battery charge state 118 of a robot 109, the robot 109 can be assigned a mission that optimizes the robot utilization and increases productivity of material handling tasks by the robots 109 in the facility 100.

Figure 2:
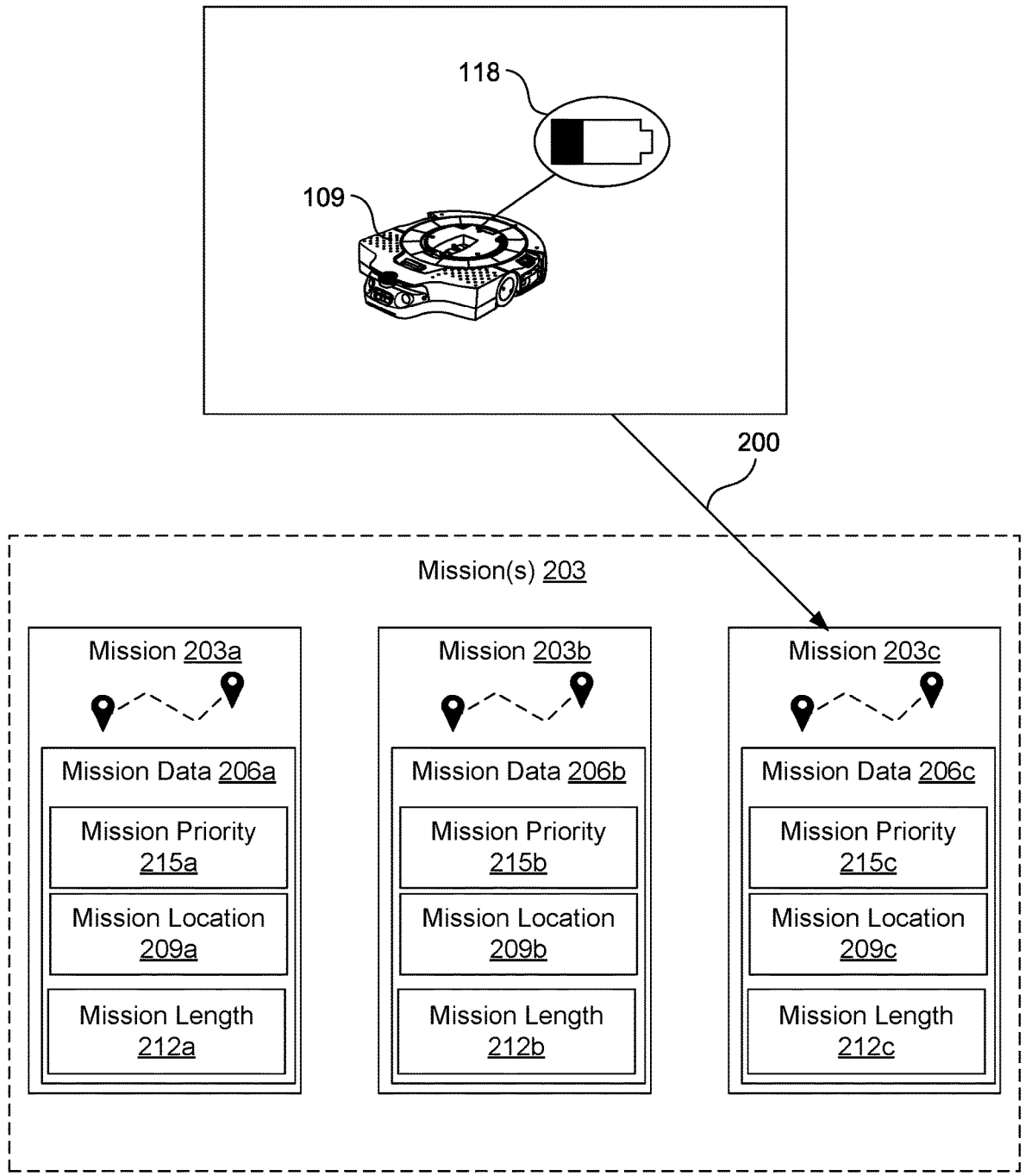
FIG. 2 illustrates an example of an autonomous mobile robot being assigned to an available mission based at least in part on the battery charge state of the autonomous mobile robot according to various aspects of the embodiments of the present disclosure.

FIG. 2 illustrates an example of a robot mission assignment 200 where a robot 109 is assigned to a particular mission 203a based at least in part on the battery charge state 118 according to various aspects of the embodiments of the present disclosure. In various examples, the robot 109 can be one of a plurality of robots 109 (e.g., a fleet) that are capable of assisting in various different tasks or missions 203 within a material handling facility 100. The robot 109 can be associated with robot data that includes characteristics of the robot 109 including a robot location and a battery charge state 118. A mission 203 can correspond to the performance of one or more tasks within the facility, such as, for example, the transport of one or more items (e.g., product inventory 103, load handlers 106, items, etc.).

At any given time in a material handling facility 100, there can be one or more missions 203 that need to be performed. Mission data 206 (e.g., 206a, 206b, 206c) associated with a given mission 203 can include various characteristics that can be used to define a given mission 203. For example, the mission data 206 can include a mission location 209 (e.g., 209a, 209b, 209c), a mission length 212 (e.g., 212a, 212b, 212c), a mission priority 215 (e.g., 215a, 215b, 215c), a mission destination, and/or other data. The mission location 209 can correspond to a starting location of a mission (e.g., location of a load handler 106 requiring movement). A mission length 212 can correspond to a distance between the starting location and the mission destination. For example, the mission length 212 for a short mission 203 can be about 30 feet whereas a mission length 212 for a long mission 203 may be about 1000 feet. A mission priority 215 can comprise an assigned priority value associated with a level of importance and urgency of completion for a given mission 203 relative to other missions 203 requiring completion.

In the example of FIG. 2, the optimal robot mission assignment 200 is determined according to an analysis of the robot data of the robot 109 including the battery charge state 118 and the mission data 206 of the different available missions 203. According to various examples, the determined robot mission assignment 200 optimizes robot utilization and increases productivity within the material handling facility 100. In determining the optimal robot mission assignment, various factors associated with the missions 203 and the robot 109 are considered. For example, the factors may include the battery charge state 118, a robot location, a mission location 209, a mission priority 215, a mission length 212, an estimated mission completion time, a load time, an unload time, a number of passing events, a number of stop events, a deceleration capability, a robot speed, a robot task capability, a robot task status, a robot battery health, and/or other factors.

In various examples, one or more factors are calculated or estimated using the robot data, the mission data 206, historical and/or learned data associated with characteristics of the facility (e.g., areas of congestion, other known missions being performed, etc.), and/or other types of data. For example, a robot speed can be estimated based at least in part on the load weight associated with a given mission, an understanding of a likely path that the robot 109 will take during the performance of a given mission, an aisle width of the aisles within the material handling facility 100, and/or other factors. According to various examples, weights can be assigned to one or more of the factors, and a score can be generated for a given robot mission assignment based at least in part on the weights assigned to the factors (e.g., a sum of weights). In some examples, a robot mission assignment having a score that meets or exceeds a given threshold can be determined to be the optimal robot mission assignment for a given robot 109. In other examples, scores associated with different potential robot mission assignments (e.g., robot 109 to mission 203a, robot 109 to mission 203b) can be generated and ranked and the robot mission assignment 200 having the highest ranked score may be selected as being the optimal robot mission assignment to optimize robot utilization.

In FIG. 2, although the robot 109 appears to have a low battery charge state 118, the robot 109 is assigned to perform a mission 203c that allows for the robot 109 to continue to assist in the completion of tasks within the material handling facility 100 before the robot 109 is required to go to a charging station 112. As such, upon determination of the robot mission assignment, the robot 109 can be instructed to perform the mission 203c. In some examples, the robot 109 can be available to complete additional missions 203 after completion of the mission 203c. In other examples, the robot 109 can be sent a command to go to a charging station 112 to recharge prior to being assigned an additional mission 203.

In the following discussion, a general description of the system and its components is provided, followed by a discussion of the operation of the same.

Figure 3:
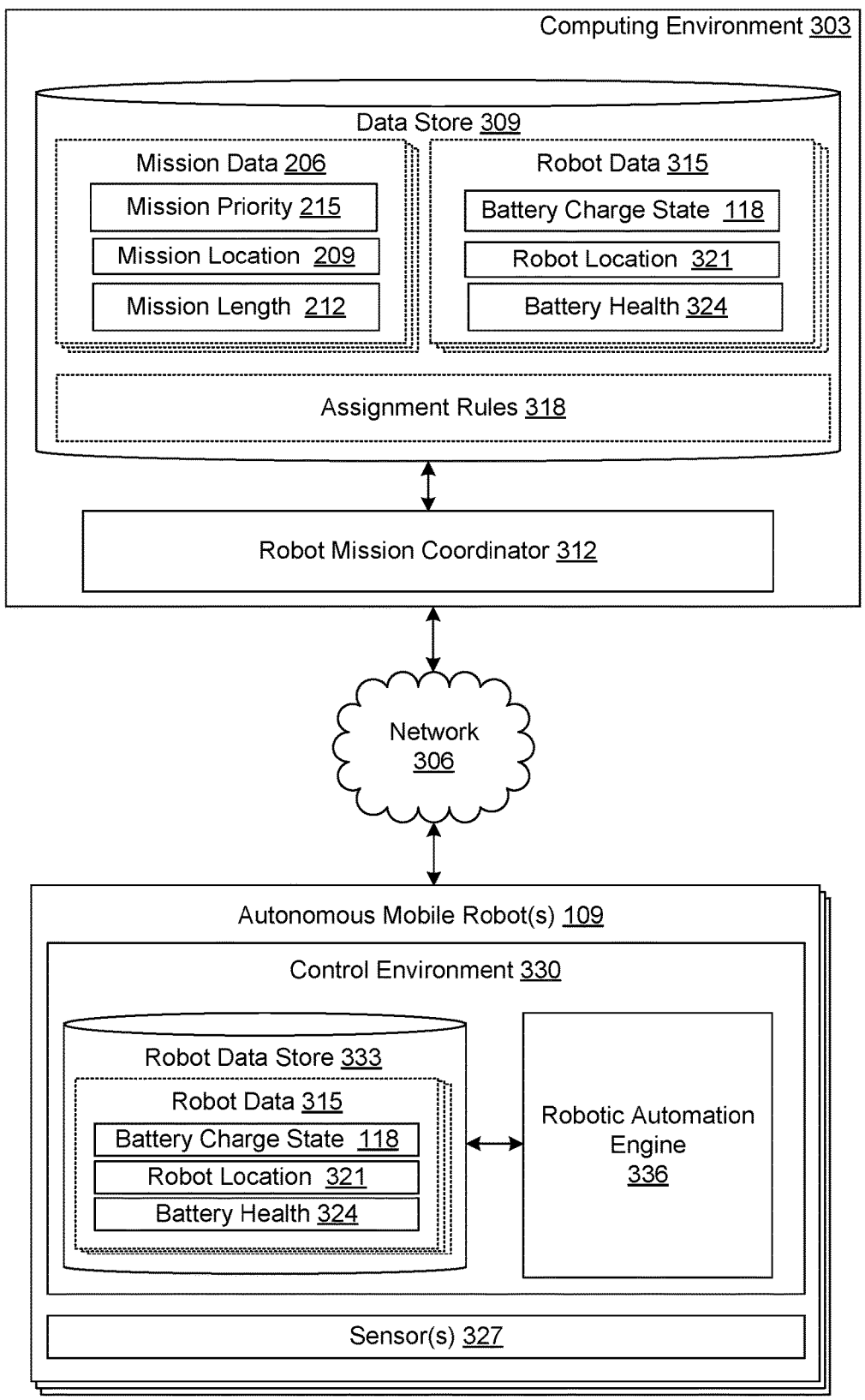
FIG. 3 is a schematic block diagram of a networked environment according to various embodiments of the present disclosure.

With reference to FIG. 3, shown is a networked environment 300 according to various embodiments. The networked environment 300 includes a computing environment 303 and one or more autonomous mobile robots 109, which are in data communication with each other via a network 306. The network 306 includes, for example, the Internet, intranets, extranets, wide area networks (WANs), local area networks (LANs), wired networks, wireless networks, cable networks, satellite networks, or other suitable networks, etc., or any combination of two or more such networks.

The computing environment 303 can comprise, for example, a server computer or any other system providing computing capability. Alternatively, the computing environment 303 can employ a plurality of computing devices that may be arranged, for example, in one or more server banks or computer banks or other arrangements. Such computing devices can be located in a single installation or may be distributed among many different geographical locations. For example, the computing environment 303 can include a plurality of computing devices that together may comprise a hosted computing resource, a grid computing resource, and/or any other distributed computing arrangement. In some cases, the computing environment 303 can correspond to an elastic computing resource where the allotted capacity of processing, network, storage, or other computing-related resources may vary over time.

Various applications and/or other functionality can be executed in the computing environment 303 according to various embodiments. Also, various data is stored in a data store 309 that is accessible to the computing environment 303. The data store 309 can be representative of a plurality of data stores 309 as can be appreciated. The data stored in the data store 309, for example, is associated with the operation of the various applications and/or functional entities described below.

The components executed on the computing environment 303, for example, include a robot mission coordinator 312, and other applications, services, processes, systems, engines, or functionality not discussed in detail herein. The robot mission coordinator 312 is executed to determine robot mission assignments 200 and delegate missions 203 to robots 109 based at least in part on the robot mission assignments 200. In various examples, the robot mission coordinator 312 optimizes the robot utilization and increases productivity of material handling tasks by the robots 109 in a material handling facility 100 by determining robot mission assignments 200 based at least in part on the battery charge state 118 of robots 109.

Upon obtaining robot data 315 from the robots 109 and mission data 206 associated with unassigned missions 203, the robot mission coordinator 312 analyzes various factors associated with the missions 203 and the robots 109 and determines the optimal robot mission assignments 200 that maximize robot utilization of robots 109. For example, the factors can include the battery charge state 118, a robot location, a mission location 209, a mission priority 215, a mission length 212, an estimated mission completion time, a load time, an unload time, a number of passing events, a number of stop events, a deceleration capability, a robot speed, a robot task capability, a robot task status, a robot battery health, and/or other factors.

In some examples, the robot mission coordinator 312 identifies a particular robot 109 and available missions 203 that can be performed by the particular robot 109. For example, a robot 109 can be identified based at least in part on a robot location 321, a robot state (e.g., whether the robot is currently performing a mission, whether the robot is charging, whether the robot is waiting for an assignment, etc.), and/or other factors. In various examples, the robot mission coordinator 312 analyzes the robot data 315 including the battery charge state 118 and, based on the analysis, selects a mission 203 from the plurality of missions 203 that optimizes robot utilization of the robot 109. In other examples, a mission 203 is identified and a plurality of robots 109 are identified based at least in part on the mission location 209. In this example, the mission data 206 of the mission 203 is analyzed along with the robot data 315 for each of the identified robots to determine which robot 109 is best suited to perform the mission 203 such that robot utilization is maximized.

In other examples, the robot mission coordinator 312 determines a plurality of potential robot mission assignments by determining all possible combinations of robots 109 and unassigned missions 203 within a facility 100. In this example, a score can be generated for each potential robot mission assignment based at least in part on the mission data 206, robot data 315, historical or learned data associated with the environment, and/or other data. When a score of a given robot mission assignment meets or exceeds a predefined threshold, the robot mission assignment 200 can be established.

In various examples, the robot mission coordinator 312 communicates with the robot 109 of a given robot mission assignment 200 to instruct the robot 109 to perform the tasks of the corresponding given mission 203 within the facility 100. During the completion of the mission 203, the robot 109 can continue to provide robot data 315 and mission status data to the robot mission coordinator 312. As such, the robot mission coordinator 312 can update any robot mission assignments 200 to optimize robot utilization and increase productivity within the facility 100.

The data stored in the data store 309 includes, for example, mission data 206, robot data 315, assignment rules 318, and potentially other data. The mission data 206 can include a mission location 209, a mission length 212, a mission priority 215, a mission destination, and/or other data. The mission location 209 can correspond to a starting location of a mission (e.g., location of a load handler 106 requiring movement) within the robot field environment (e.g., material handling facility 100). A mission length 212 can correspond to a distance between the starting location and the destination location of the mission. For example, the mission length 212 for a short mission 203 may be about 30 feet whereas a mission length 212 for a long mission 203 may be about 1000 feet. A mission priority 215 can comprise an assigned priority value associated with a level of importance and urgency of completion of a given mission 203 relative to other missions 203 requiring completion. In various examples, the mission data 206 is user defined. In other examples, the mission data 206 is automatically generated in response to an automatic detection of tasks to be performed within the facility 100.

The robot data 315 corresponds to data obtained by the robot 109 that defines various properties of the robot 109. The robot data 315 can include, for example, a battery charge state 118, a robot location 321, battery health 324, a robot task capability, a robot task status, and/or other data. The battery charge state 118 for a given robot 109 defines a level of charge of the battery relative to its capacity. In various examples, the battery charge state 118 can define a percentage of charge of a battery (e.g., 0-100%). The robot location 321 corresponds to a location of the robot 109 within the material handling facility 100 or robot field environment. The battery health 324 corresponds to the overall health of the battery. During the lifetime of a battery, the overall performance of the battery may decline such that the maximum battery capacity of the battery is less than the maximum battery capacity of a new battery. As such, the battery health 324 can be a useful factor considered by the robot mission coordinator 312 to indicate how the battery of a given robot 109 can perform during a given mission 203. In some examples, the robot mission coordinator 312 can obtain the robot data 315 associated with the robot 109 in response to a request sent to the robot 109. In other examples, the robot 109 transmits the robot data 315 to the computing environment 303 periodically and the robot mission coordinator 312 obtains the robot data 315 from the data store 309.

The assignment rules 318 include rules, models, and/or configuration data for various algorithms or approaches employed by the robot mission coordinator 312. In various examples, the assignment rules 318 include various models and/or algorithms for analyzing the robot data 315 and mission data 206 to determine robot mission assignments 200 that optimize robot utilization of a given robot 109. In various examples, the assignment rules 318 can include weights to assign various factors that are analyzed when determining robot mission assignments. For example, the factors can include the battery charge state 118, a robot location, a mission location 209, a mission priority 215, a mission length 212, an estimated mission completion time, a load time, an unload time, a number of passing events, a number of stop events, a deceleration capability, a robot speed, a robot task capability, a robot task status, a robot battery health, and/or other variables. In various examples, the assignment rules 318 can provide rules and equations for calculating or estimating one or more of the factors based at least in part on the robot data 315, mission data 206, learned historical data, and/or other data.

The robot 109 comprises an autonomous mobile robot that can be implemented to assist with a number of different tasks at various locations in material handling facilities 100. The robot 109 can comprise a battery bank, a wireless charging module, power converters, and other components of a power system. The battery bank can be embodied as any suitable battery bank, including one or more sealed lead acid, lithium ion, nickel metal hydride, or other battery technologies, along with a power converter to charge and discharge the battery bank.

In various examples, the robot 109 incorporates sensors 327, such as cameras, radar systems, light detection and ranging (LIDAR) systems, optical sensors, weight sensors, position sensors, position encoders, interlock sensors, and other sensors within the drive systems, latching and catching assemblies, and other components. The operational feedback data from all the sensors 327 in the robot 109 can be stored and processed by the control environment 330.

The control environment 330 can be embodied as a control system for the robot 109, including one or more processors, processing devices, circuits, and memory devices. The control environment 330 can be implemented using a combination of hardware and software. The control environment 330 can be implemented as an embedded control system of the robot 109 itself (e.g., a programmable logic controller (PLC) of the robot 109), implemented separate from the robot 109, or be embodied as a hybrid of local and remote processing systems. The control environment 330 can interface with the electromechanical and sensor systems of the robot 109 in any suitable way, such as through one or more local interfaces, wired or wireless network interfaces, or other suitable interfaces. Additionally, the control environment 330 can include one or more network interfaces for data communications, including wireless network interfaces for data and control communications with other computing environments 303 and systems within the material handling facility 100, for example.

The control environment 330 is configured to direct the overall operation of the robot 109 in the automated performance of missions 203 (e.g., transport of items) within the material handing facility 100. In that sense, the control environment 330 is configured to direct the drive, wheel, and lift systems of the robot 109, among other electromechanical systems. The control environment 330 is also configured to direct the operation of the sensors 327 of the robot 109, gather operational feedback data from the sensors 327, process the data, and direct the drive systems of the robot 109 based on the data.

The control environment 330 includes a robot data store 333 and a robotic automation engine 336. The robot data store 333 can store operational data for the robot 109 For example, the robot data store 333 can store robot data 315, route data, sensor data, operational status data, and other system operation and telematics data, among other types of data. The robot data store 333 can also store operational feedback data generated by the sensors 327 of the robot 109.

The data in the robot data store 333 can be processed by the robotic automation engine 336, as part of one or more command and control algorithms for the operation of the robot 109. For example, the robotic automation engine 336 can use image, radar, LIDAR, and other feedback data from the sensors 327 as input for computer-vision algorithms suitable for directing the robot 109. In various examples, the robotic automation engine 336 directs the robot 109 to engage with a load handler 106 to assist in the transport of items supported by the load handler 106 to various locations within the material handling facility 100. Once a given mission 203 has been completed, the robotic automation engine 336 can cause the robot 109 to disengage with the load handler 106 and travel away from the load handler 106 until the robot 109 is outside the proximity with the load handler 106 to allow the robot to move to another location without interference of the load handler 106. Once the robot has moved away from the load handler, the robotic automation engine 336 can direct the robot 109 to drive to another location.

Next, a general description of the operation of the various components of the networked environment 300 is provided with reference to FIGS. 4-7.

Figure 4:
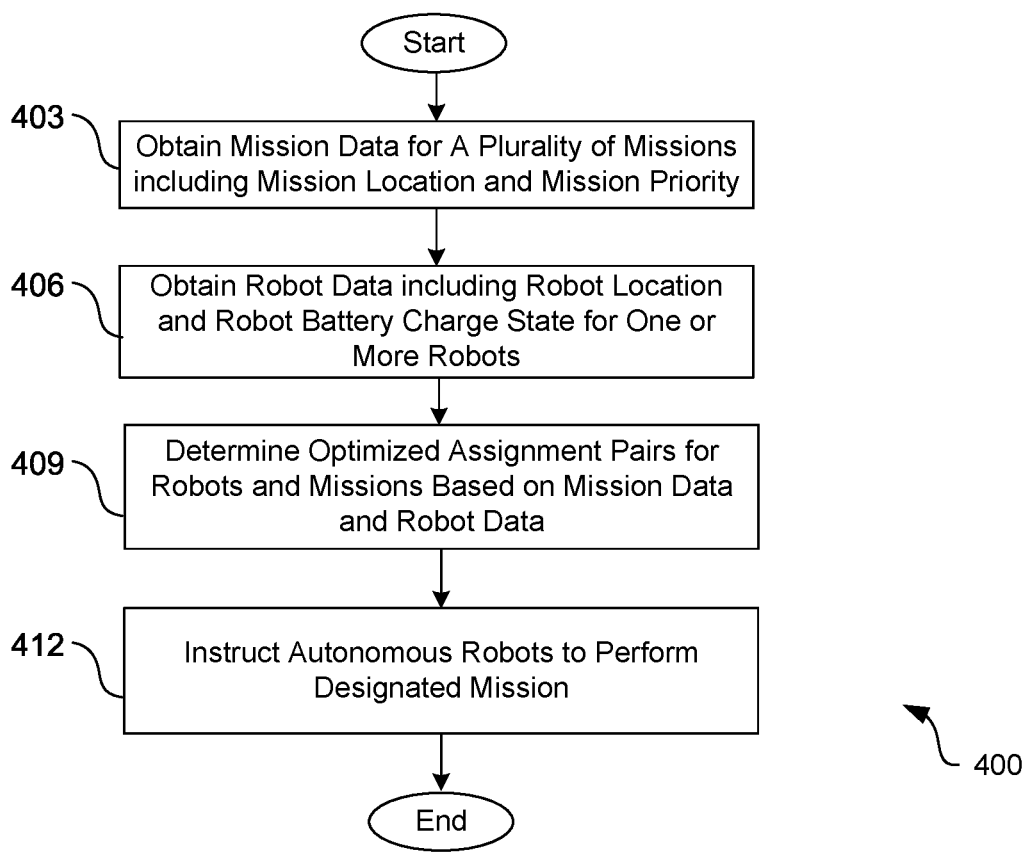
FIGS. 4-7 are flowcharts illustrating examples of functionality implemented as portions of the robot mission coordinator executed in a computing environment in the networked environment of FIG. 3 according to various embodiments of the present disclosure.

Referring next to FIG. 4, shown is a flowchart 400 that provides one example of the operation of a portion of the robot mission coordinator 312 according to various embodiments. It is understood that the flowchart of FIG. 4 provides merely an example of the many different types of functional arrangements that may be employed to implement the operation of the portion of the robot mission coordinator 312 as described herein. As an alternative, the flowchart of FIG. 4 may be viewed as depicting an example of elements of a method implemented in the computing environment 303 (FIG. 3) according to one or more embodiments.

Beginning with box 403, the robot mission coordinator 312 obtains mission data 206 for a plurality of unassigned missions 203 to be completed in a given environment. A mission relates to assisting with one or more different tasks at various locations in the given environment (e.g., material handling facility 100). For example, a mission 203 can correspond to the movement and transport of a given item, article, or product between different locations within a material handling facility 100. Mission data 206 associated with a given mission 203 can include various characteristics that may be used to define a given mission 203. The mission data 206 can include a mission location 209, a mission length 212, a mission priority 215, a mission destination, and/or other data. In various examples, the mission data 206 is user defined. In other examples, the mission data 206 is automatically generated in response to an automatic detection of tasks to be performed within the environment. In various examples, the mission data 206 can be obtained from the data store 309.

At box 406, the robot mission coordinator 312 obtains robot data 315 for one or more robots 109. The robot data 315 corresponds to data obtained by the robot 109 that defines various properties of the robot 109. The robot data 315 can include, for example, a battery charge state 118, a robot location 321, battery health 324, a robot task capability, a robot task status, and/or other data. In some examples, the robot mission coordinator 312 can obtain the robot data 315 associated with the robot 109 in response to a request sent to the robot 109. In other examples, the robot 109 transmits the robot data 315 to the computing environment 303 periodically and the robot mission coordinator 312 obtains the robot data 315 from the data store 309.

At box 409, the robot mission coordinator 312 determines one or more optimized robot mission assignments for the robots 109 and the missions 203 based at least in part on the mission data 206 and the robot data 315. In various examples, the robot mission coordinator 312 analyzes one or more assignment factors associated with both a given mission 203 and a given autonomous robot 109 of a potential robot mission assignment. For example, the assignment factors can include a robot battery state of charge, a robot location, a mission location, a mission priority, a mission length 212, an estimated mission completion time, a load time, an unload time, a number of passing events, a number of stop events, a deceleration capability, a robot speed, a robot task capability, a robot task status, a robot battery health, and/or other factors.

In some examples, the robot mission coordinator 312 calculates or estimates one or more of the factors based at least in part on the robot data 315, the mission data 206, learned historical data (e.g., congestion data associated with the material handling facility 100), and/or other factors. For example, one of the factors used to determine an optimal robot mission assignment 200 comprises an estimated speed of the robot 109 during completion of the mission 203. As a robot 109 performs a mission 203 various obstacles can affect the overall speed of the robot 109. As such, the robot mission coordinator 312 can estimate a robot speed of the robot 109 based at least in part on an analysis of the robot data 315, mission data 206, learned historical data or other factors. In one example, the speed can be determined using the following equations:

$$vel_{max} = \frac{(Width_{aisle} - SQUARE) \times decel_{max}}{STAR} \quad (1)$$

$$SQUARE = (width_{Xa} + 2 \cdot margin_{nav} + STAR \cdot latency_{safety}) \quad (2)$$

$$STAR = 2 \cdot vel_{obstacle} \cdot (1 + 2 \cdot error_{sensor}) \quad (3)$$

where $width_{xa}$=drive width, $margin_{nav}$=distance a side margin of navigation imposes beyond a safety bubble, $vel_{obstacle}$=adversarial particle velocity, and $error_{sensor}$=range sensor error. It should be noted that in determining the speed there are assumptions which can be made. The assumptions can include aisle width (e.g., 6 feet), deceleration capacity (e.g., 1.5 meters per second squared), passing event time (e.g., 1.5 meters at 0.025 meters per second or less), maximum speed (e.g., 0.3 meters per second), stop event times (e.g., 5 seconds per stoppage), cart load and unload time (e.g., 15 seconds), total power consumption, and/or other assumptions. In some examples, the assumptions can be based at least in part on learned historical data. For example, if a particular area is known to be congested during a given time and the mission 203 requires the robot 109 to navigate through the area, the number of passing events and/or the number of stop events can be increased.

In various examples, the robot mission coordinator 312 can estimate a mission completion time based at least in part on one or more of the factors including, for example, the robot speed, the load time, the unload time, the mission length 212, the load weight, the robot location, the mission location, an estimated number of passing events, an estimated number of stop events, and/or other factors. For example, these factors can be used to calculate an estimated mission completion time, which is relevant in determining whether a battery charge state 118 of a given battery is sufficient to complete the tasks of the mission 203.

According to various examples, weights can be assigned to one or more of the factors, and a score can be generated for a given robot mission assignment 200 based at least in part on the weights assigned to the factors (e.g., a sum of weights). In various examples, the weights for a given factor can be defined by the assignment rules 318. In some examples, a robot mission assignment 200 having a score that meets or exceeds a given threshold can be determined to be the optimal robot mission assignment for a given robot 109. In other examples, scores associated with different potential robot mission assignments 200 can be generated and ranked and the robot mission assignment having the highest ranked score can be selected as being the optimal robot mission assignment to optimize robot utilization.

At box 412, the robot mission coordinator 312 instructs the robots 109 to perform the designated missions 203 based at least in part on the optimized robot mission assignments. In particular, the robot mission coordinator 312 interacts with the control environment 330 of the robot 109 and transmits mission data 206 to the robot 109 defining the mission 203 to be performed. Upon receiving the mission data 206, the robotic automation engine 336 of the robot 109 can drive and direct the robot 109 to complete the tasks associated with the mission 203. Thereafter, this portion of the process proceeds to completion.

Figure 5:
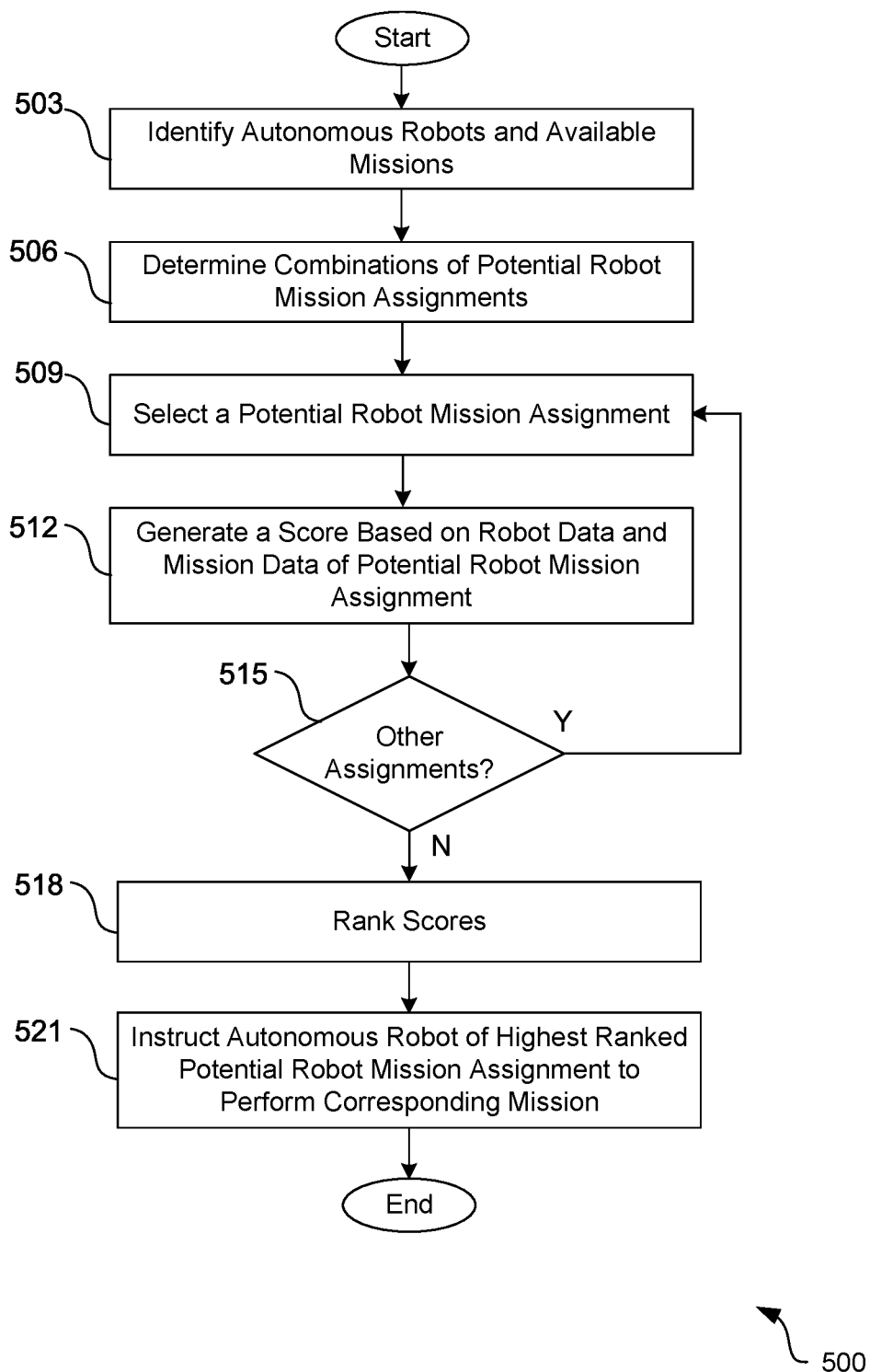

Referring next to FIG. 5, shown is a flowchart 500 that provides one example of the operation of a portion of the robot mission coordinator 312 according to various embodiments. It is understood that the flowchart of FIG. 5 provides merely an example of the many different types of functional arrangements that may be employed to implement the operation of the portion of the robot mission coordinator 312 as described herein. As an alternative, the flowchart of FIG. 5 may be viewed as depicting an example of elements of a method implemented in the computing environment 303 (FIG. 3) according to one or more embodiments.

Beginning with box 503, the robot mission coordinator 312 identifies robots 109 and unassigned missions 203 for a given environment. For example, one or more robots 109 can be identified based at least in part on a robot location 321, a robot state (e.g., whether the robot is currently performing a mission, whether the robot is charging, whether the robot is waiting for an assignment, etc.), and/or other factors. Missions 203 can be identified based at least in part on a listing of one or more unassigned missions 203. In some examples, the missions 203 are assigned a mission priority 215 value and the identified missions 203 are based at least in part on a predefined threshold number of top priority missions 203. A mission priority 215 can comprise an assigned priority value associated with a level of importance and urgency of completion of a given mission 203 relative to other missions 203 requiring completion.

At box 506, the robot mission coordinator 312 determines all possible combinations of identified robots 109 and missions 203. For example, assume that there are three robots 109 (e.g., Robot A, Robot B, and Robot C) and there are two missions 203 (e.g., Mission A, Mission B) to be completed. In this example, the robot mission coordinator 312 will identify six combinations: Robot A—Mission A, Robot A—Mission B; Robot B—Mission A; Robot B—Mission B; Robot C—Mission A; and Robot C—Mission B.

At box 509, the robot mission coordinator 312 selects a combination pair from the different combinations of robots 109 and missions 203. In various examples, the combination pair is selected according to mission priority 215, randomly, based at least in part on a robot identifier, etc.

At box 512, the robot mission coordinator 312 generates a score based at least in part on the robot data 315 and the mission data 206 associated with the robot 109 and mission 203 of the selected combination pair. In various examples, the score is generated based at least in part on one or more factors. The factors can include, for example, the battery charge state 118, a robot location, a mission location 209, a mission priority 215, a mission length 212, an estimated mission completion time, a load time, an unload time, a number of passing events, a number of stop events, a deceleration capability, a robot speed, a robot task capability, a robot task status, a robot battery health, and/or other variables. In various examples, the assignment rules 318 can provide rules and equations for calculating or estimating one or more of the factors based at least in part on the robot data 315, mission data 206, learned historical data, and/or other data. In various examples, the score can correspond to a sum of weights assigned to the one or more factors based at least in part on the assignment rules 318 and value associated with the one or more factors. In various examples, the scores represent robot utilization associated with the robot 109 performing the corresponding mission 203.

At box 515, the robot mission coordinator 312 determines whether there are additional combination pairs to be analyzed. If there are additional combination pairs to be analyzed, the robot mission coordinator 312 returns to box 509. Otherwise, the robot mission coordinator 312 proceeds to box 518.

At box 518, the scores associated with the potential robot mission assignments are ranked. In some examples, a lower score indicates a greater robot utilization. In other examples, a higher score indicates a greater robot utilization. The scores are ranked such that the highest ranked robot mission assignment yields the optimal robot utilization.

At box 521, the robots 109 of the highest ranked robot mission assignments 200 are instructed to perform the corresponding missions 203. In particular, the robot mission coordinator 312 can interact with the control environment 330 of the robot 109 and transmit mission data 206 to the robot 109 defining the mission 203 to be performed. Upon receiving the mission data 206, the robotic automation engine 336 of the robot 109 can drive and direct the robot 109 to complete the tasks associated with the mission 203. Thereafter, this portion of the process proceeds to completion.

Figure 6:
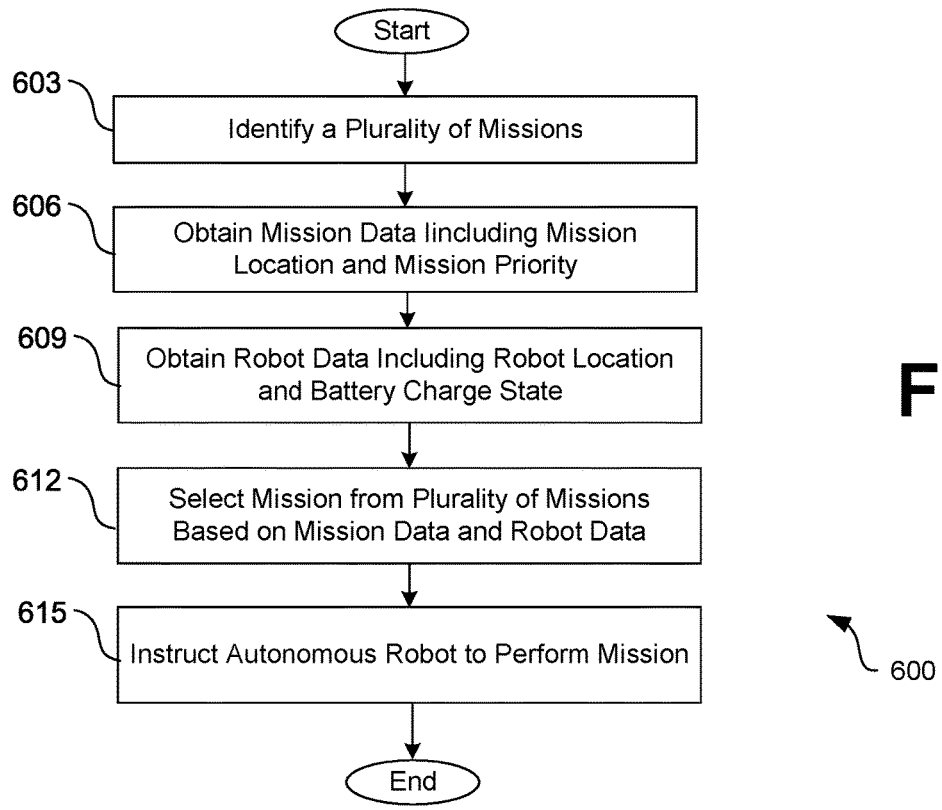

Referring next to FIG. 6, shown is a flowchart 600 that provides one example of the operation of a portion of the robot mission coordinator 312 according to various embodiments. It is understood that the flowchart of FIG. 6 provides merely an example of the many different types of functional arrangements that may be employed to implement the operation of the portion of the robot mission coordinator 312 as described herein. As an alternative, the flowchart of FIG. 6 may be viewed as depicting an example of elements of a method implemented in the computing environment 303 (FIG. 3) according to one or more embodiments.

Beginning with box 603, the robot mission coordinator 312 identifies a plurality of missions 203 that need to be assigned. Missions 203 can be identified based at least in part on a listing of one or more unassigned missions 203. In some examples, the identified missions 203 can be a subset of missions in the listing of unassigned missions and can be identified based at least in part on a mission length 212, mission location 209, mission priority 215, and/or other factors.

At box 606, the robot mission coordinator 312 obtains mission data 206 including the mission location 209 and mission priority 215. Mission data 206 associated with a given mission 203 can include various characteristics that may be used to define a given mission 203. The mission data 206 can include a mission location 209, a mission length 212, a mission priority 215, a mission destination, and/or other data. In various examples, the mission data 206 is user defined. In other examples, the mission data 206 is automatically generated in response to an automatic detection of tasks to be performed within the environment. In various examples, the mission data 206 can be obtained from the data store 309.

At box 609, the robot mission coordinator 312 obtains robot data 314 including a robot location and a battery charge state 118 of a given robot 109. The robot data 315 corresponds to data obtained by the robot 109 that defines various properties of the robot 109. The robot data 315 can include, for example, a battery charge state 118, a robot location 321, battery health 324, a robot task capability, a robot task status, and/or other data. In some examples, the robot mission coordinator 312 can obtain the robot data 315 associated with the robot 109 in response to a request to the robot 109. In other examples, the robot 109 transmits to the robot data 315 to the computing environment 303 periodically and the robot mission coordinator 312 obtains the robot data 315 from the data store 309.

At box 612, the robot mission coordinator 312 selects a mission 203 from the plurality of missions 203 to determine the optimal robot mission assignment 200. The mission 203 is selected in response to an analysis of the robot data of the robot 109 including the battery charge state 118 and the mission data 206 of the different available missions 203. In determining the optimal robot mission assignment 200, various factors associated with the missions 203 and the robot 109 are considered. For example, the factors can include the battery charge state 118, a robot location, a mission location 209, a mission priority 215, a mission length 212, an estimated mission completion time, a load time, an unload time, a number of passing events, a number of stop events, a deceleration capability, a robot speed, a robot task capability, a robot task status, a robot battery health, and/or other factors.

According to various examples, weights can be assigned to one or more of the factors, and a score can be generated for a given robot mission assignment 200 based at least in part on the weights assigned to the factors (e.g., a sum of weights). In some examples, a robot mission assignment 200 having a score that meets or exceeds a given threshold can be determined to be the optimal robot mission assignment 200 for the given robot 109. In other examples, scores associated with different potential robot mission assignments 200 can be generated and ranked and the robot mission assignment 200 having the highest ranked score can be selected as being the optimal robot mission assignment 200 to optimize robot utilization.

At box 615, the robot mission coordinator 312 instructs the robot 109 to perform the selected mission 203. In particular, the robot mission coordinator 312 can interact with the control environment 330 of the robot 109 and transmit mission data 206 to the robot 109 defining the mission 203 to be performed. Upon receiving the mission data 206, the robotic automation engine 336 of the robot 109 can drive and direct the robot 109 to complete the tasks associated with the mission 203. Thereafter, this portion of the process proceeds to completion.

Figure 7:
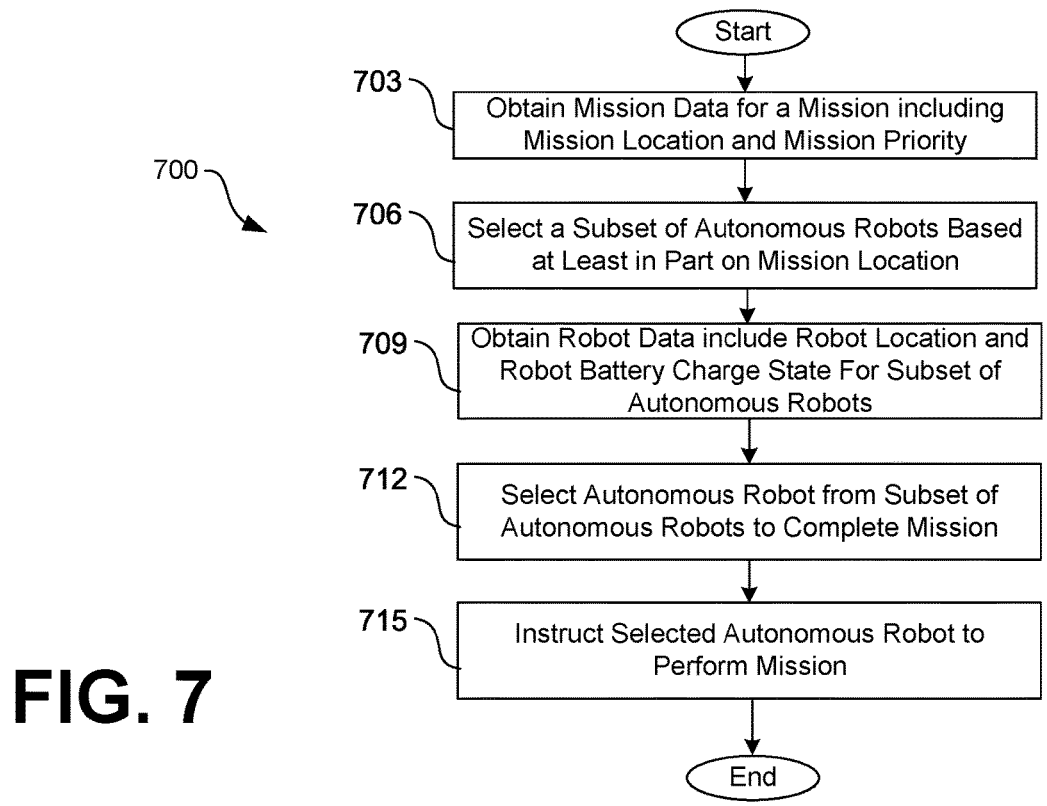

Referring next to FIG. 7, shown is a flowchart 700 that provides one example of the operation of a portion of the robot mission coordinator 312 according to various embodiments. It is understood that the flowchart of FIG. 7 provides merely an example of the many different types of functional arrangements that may be employed to implement the operation of the portion of the robot mission coordinator 312 as described herein. As an alternative, the flowchart of FIG. 7 may be viewed as depicting an example of elements of a method implemented in the computing environment 303 (FIG. 3) according to one or more embodiments.

Beginning with box 703, the robot mission coordinator 312 obtains mission data 206 including the mission location 209 and the mission priority 215. The mission data 206 is associated with a particular mission 203 that needs to be completed and requires assignment. The mission data 206 can include a mission location 209, a mission length 212, a mission priority 215, a mission destination, and/or other data. In various examples, the mission data 206 is user defined. In other examples, the mission data 206 is automatically generated in response to an automatic detection of tasks to be performed within the environment. In various examples, the mission data 206 can be obtained from the data store 309.

At box 706, the robot mission coordinator 312 selects a subset of robots 109 from a plurality of robots 109 within a given environment (e.g., material handling facility 100). The subset of robots 109 are selected based at least in part on a robot location 321. For example, only robots 109 that are located within a predefined distance of the mission location 209 can be considered when determining an optimal robot mission assignment 200. Accordingly, the robots 109 that fail to meet the threshold distance can be filtered out and excluded from further consideration.

At box 709, the robot mission coordinator 312 obtains robot data 314 including a robot location and a battery charge state 118 of each robot 109 in the subset of robots 109. The robot data 315 can include, for example, a battery charge state 118, a robot location 321, battery health 324, a robot task capability, a robot task status, and/or other data. In some examples, the robot mission coordinator 312 can obtain the robot data 315 associated with the robots 109 in response to a request sent to the robots 109. In other examples, the robots 109 transmit to the robot data 315 to the computing environment 303 periodically and the robot mission coordinator 312 obtains the robot data 315 from the data store 309.

At box 712, the robot mission coordinator 312 selects a robot 109 from the subset of robots 109 to perform the mission 203 such that the robot utilization is maximized. The robot 109 is selected in response to an analysis of the robot data 315 of the different robots 109 including the battery charge state 118 and the mission data 206 of the mission 203. In selecting the robot 109 to define the optimal robot mission assignment 200, various factors associated with the mission 203 and the robots 109 are considered. For example, the factors can include the battery charge state 118, a robot location, a mission location 209, a mission priority 215, a mission length 212, an estimated mission completion time, a load time, an unload time, a number of passing events, a number of stop events, a deceleration capability, a robot speed, a robot task capability, a robot task status, a robot battery health, and/or other factors.

According to various examples, weights can be assigned to one or more of the factors, and a score can be generated for a given robot mission assignment 200 based at least in part on the weights assigned to the factors (e.g., a sum of weights). In some examples, a robot mission assignment 200 having a score that meets or exceeds a given threshold can be determined to be the optimal robot mission assignment 200 for the given robot 109. In other examples, scores associated with different potential robot mission assignments 200 can be generated and ranked, and the robot mission assignment 200 having the highest ranked score can be selected as being the optimal robot mission assignment 200 to optimize robot utilization.

At box 715, the robot mission coordinator 312 instructs the selected robot 109 to perform the mission 203. In particular, the robot mission coordinator 312 can interact with the control environment 330 of the robot 109 and transmit mission data 206 to the robot 109 defining the mission 203 to be performed. Upon receiving the mission data 206, the robotic automation engine 336 of the robot 109 can drive and direct the robot 109 to complete the tasks associated with the mission 203. Thereafter, this portion of the process proceeds to completion.

Figure 8:
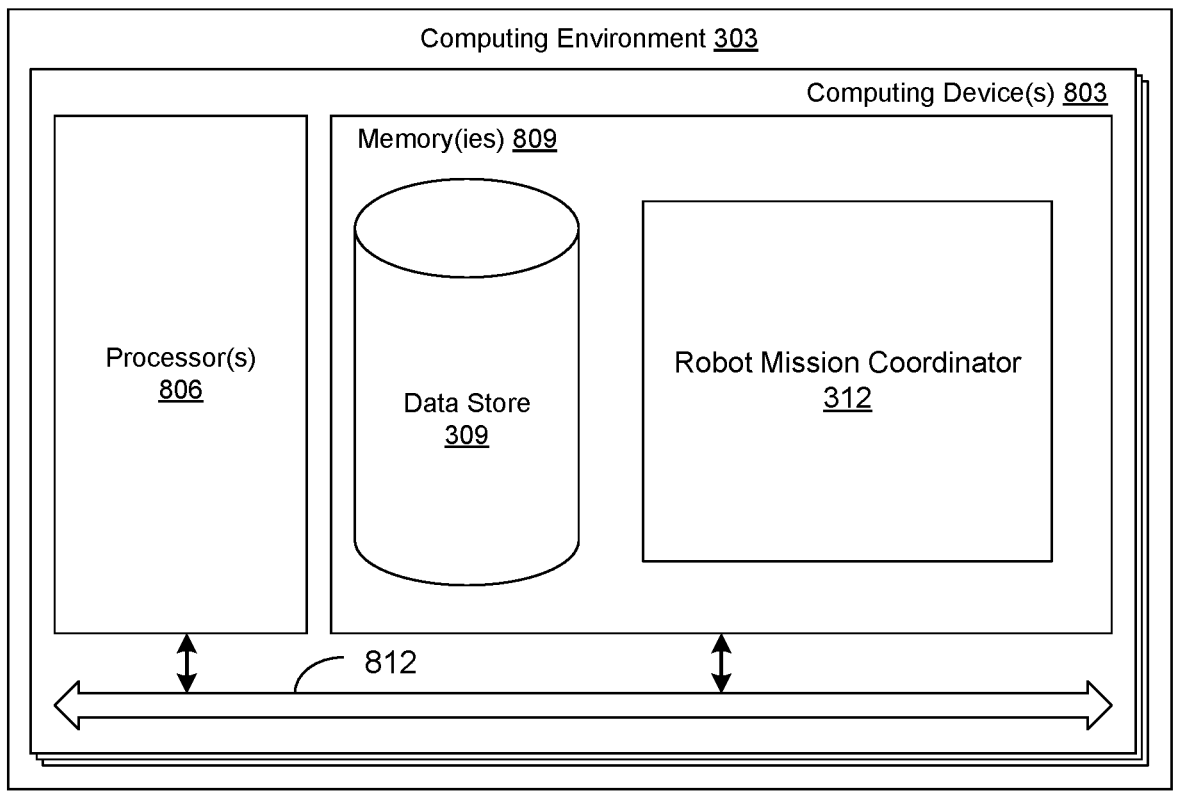
FIG. 8 is a schematic block diagram that provides one example illustration of a computing environment employed in the networked environment of FIG. 3 according to various embodiments of the present disclosure.

With reference to FIG. 8, shown is a schematic block diagram of the computing environment 303 according to an embodiment of the present disclosure. The computing environment 303 includes one or more computing devices 803. Each computing device 803 includes at least one processor circuit, for example, having a processor 806 and a memory 809, both of which are coupled to a local interface 812. To this end, each computing device 803 can comprise, for example, at least one server computer or like device. The local interface 812 may comprise, for example, a data bus with an accompanying address/control bus or other bus structure as can be appreciated.

Stored in the memory 809 are both data and several components that are executable by the processor 806. In particular, stored in the memory 809 and executable by the processor 806 are the robot mission coordinator 312, and potentially other applications. Also stored in the memory 809 may be a data store 309 and other data. In addition, an operating system may be stored in the memory 809 and executable by the processor 806.

It is understood that there may be other applications that are stored in the memory 809 and are executable by the processor 806 as can be appreciated. Where any component discussed herein is implemented in the form of software, any one of a number of programming languages may be employed such as, for example, C, C++, C #, Objective C, Java®, JavaScript®, Perl, PHP, Visual Basic®, Python®, Ruby, Flash®, or other programming languages.

A number of software components are stored in the memory 809 and are executable by the processor 806. In this respect, the term "executable" means a program file that is in a form that can ultimately be run by the processor 806. Examples of executable programs may be, for example, a compiled program that can be translated into machine code in a format that can be loaded into a random access portion of the memory 809 and run by the processor 806, source code that may be expressed in proper format such as object code that is capable of being loaded into a random access portion of the memory 809 and executed by the processor 806, or source code that may be interpreted by another executable program to generate instructions in a random access portion of the memory 809 to be executed by the processor 806, etc. An executable program may be stored in any portion or component of the memory 809 including, for example, random access memory (RAM), read-only memory (ROM), hard drive, solid-state drive, USB flash drive, memory card, optical disc such as compact disc (CD) or digital versatile disc (DVD), floppy disk, magnetic tape, or other memory components.

The memory 809 is defined herein as including both volatile and nonvolatile memory and data storage components. Volatile components are those that do not retain data values upon loss of power. Nonvolatile components are those that retain data upon a loss of power. Thus, the memory 809 may comprise, for example, random access memory (RAM), read-only memory (ROM), hard disk drives, solid-state drives, USB flash drives, memory cards accessed via a memory card reader, floppy disks accessed via an associated floppy disk drive, optical discs accessed via an optical disc drive, magnetic tapes accessed via an appropriate tape drive, and/or other memory components, or a combination of any two or more of these memory components. In addition, the RAM may comprise, for example, static random access memory (SRAM), dynamic random access memory (DRAM), or magnetic random access memory (MRAM) and other such devices. The ROM may comprise, for example, a programmable read-only memory (PROM), an erasable programmable read-only memory (EPROM), an electrically erasable programmable read-only memory (EEPROM), or other like memory device.

Also, the processor 806 may represent multiple processors 806 and/or multiple processor cores and the memory 809 may represent multiple memories 809 that operate in parallel processing circuits, respectively. In such a case, the local interface 812 may be an appropriate network that facilitates communication between any two of the multiple processors 806, between any processor 806 and any of the memories 809, or between any two of the memories 809, etc. The local interface 812 may comprise additional systems designed to coordinate this communication, including, for example, performing load balancing. The processor 806 may be of electrical or of some other available construction.

Although the robot mission coordinator 312, and other various systems described herein may be embodied in software or code executed by general purpose hardware as discussed above, as an alternative the same may also be embodied in dedicated hardware or a combination of software/general purpose hardware and dedicated hardware. If embodied in dedicated hardware, each can be implemented as a circuit or state machine that employs any one of or a combination of a number of technologies. These technologies may include, but are not limited to, discrete logic circuits having logic gates for implementing various logic functions upon an application of one or more data signals, application specific integrated circuits (ASICs) having appropriate logic gates, field-programmable gate arrays (FPGAs), or other components, etc. Such technologies are generally well known by those skilled in the art and, consequently, are not described in detail herein.

The flowcharts of FIGS. 4-7 show the functionality and operation of an implementation of portions of the robot mission coordinator 312. If embodied in software, each block may represent a module, segment, or portion of code that comprises program instructions to implement the specified logical function(s). The program instructions may be embodied in the form of source code that comprises human-readable statements written in a programming language or machine code that comprises numerical instructions recognizable by a suitable execution system such as a processor 806 in a computer system or other system. The machine code may be converted from the source code, etc. If embodied in hardware, each block may represent a circuit or a number of interconnected circuits to implement the specified logical function(s).

Although the flowcharts of FIGS. 4-7 show a specific order of execution, it is understood that the order of execution may differ from that which is depicted. For example, the order of execution of two or more blocks may be scrambled relative to the order shown. Also, two or more blocks shown in succession in FIGS. 4-7 may be executed concurrently or with partial concurrence. Further, in some embodiments, one or more of the blocks shown in FIGS. 4-7 may be skipped or omitted. In addition, any number of counters, state variables, warning semaphores, or messages might be added to the logical flow described herein, for purposes of enhanced utility, accounting, performance measurement, or providing troubleshooting aids, etc. It is understood that all such variations are within the scope of the present disclosure.

Also, any logic or application described herein, including the robot mission coordinator 312, that comprises software or code can be embodied in any non-transitory computer-readable medium for use by or in connection with an instruction execution system such as, for example, a processor 806 in a computer system or other system. In this sense, the logic may comprise, for example, statements including instructions and declarations that can be fetched from the computer-readable medium and executed by the instruction execution system. In the context of the present disclosure, a "computer-readable medium" can be any medium that can contain, store, or maintain the logic or application described herein for use by or in connection with the instruction execution system.

The computer-readable medium can comprise any one of many physical media such as, for example, magnetic, optical, or semiconductor media. More specific examples of a suitable computer-readable medium would include, but are not limited to, magnetic tapes, magnetic floppy diskettes, magnetic hard drives, memory cards, solid-state drives, USB flash drives, or optical discs. Also, the computer-readable medium may be a random access memory (RAM) including, for example, static random access memory (SRAM) and dynamic random access memory (DRAM), or magnetic random access memory (MRAM). In addition, the computer-readable medium may be a read-only memory (ROM), a programmable read-only memory (PROM), an erasable programmable read-only memory (EPROM), an electrically erasable programmable read-only memory (EEPROM), or other type of memory device.

Further, any logic or application described herein, including the robot mission coordinator 312, may be implemented and structured in a variety of ways. For example, one or more applications described may be implemented as modules or components of a single application. Further, one or more applications described herein may be executed in shared or separate computing devices or a combination thereof. For example, a plurality of the applications described herein may execute in the same computing device 803, or in multiple computing devices 803 in the same computing environment 303.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

Therefore, the following is claimed:

1. A system, comprising:
   at least one computing device; and
   at least one application executable in the at least one computing device, wherein when executed the at least one application causes the at least one computing device to at least:
   identify a plurality of autonomous robots configured to perform one or more types of material handling tasks in an unstructured material handling facility;
   identify a plurality of missions associated with the one or more types of material handling tasks to be performed within the unstructured material handling facility;
   determine robot data corresponding to individual autonomous robots of the plurality of autonomous robots, the robot data comprising a battery charge state and a battery health for the individual autonomous robots;
   determine mission data for individual missions of the plurality of missions, the mission data comprising at least one of a mission priority or a mission location;
   for individual autonomous robots, estimate a respective mission completion time for individual missions of the plurality of missions based at least in part on a respective estimated robot speed, a deceleration capability, a load time, an unload time, a mission length, a load weight, an estimated quantity of passing events, an estimated quantity of stop events, and historical data defining one or more congestion areas within the material handling facility, wherein the respective estimated robot speed is based at least in part on:
   a load weight associated with an individual mission,
   an estimation of a path that the autonomous robot will take during performance of the individual mission, and
   an aisle width of one or more of a plurality of aisles within the material handling facility;
   determine at least one assignment pairing of a respective autonomous robot of the plurality of autonomous robots with a respective mission of the plurality of missions based at least in part on a ranking of assignment scores assigned to a plurality of potential assignment pairings, a respective assignment score being based at least in part on the respective mission completion time and a plurality of factors derived from the robot data, historical data associated with characteristics of the material handling facility, and the mission data, the at least one assignment pairing being determined to optimize a robot utilization of the respective autonomous robot; and
   instruct the respective autonomous robot to perform the respective mission based at least in part on the at least one assignment pairing.

2. The system of claim 1, wherein the robot data further comprises at least one of a robot location, a robot task capability, a robot battery health, or a robot task status.

3. The system of claim 1, wherein, when executed, the at least one application further causes the at least one computing device to at least determine the plurality of factors based at least in part on the robot data and the mission data, the plurality of factors comprising at least one of a mission length, a load time, an unload time, a number of passing events, a number of stop events, a deceleration capability, or the respective estimated robot speed, the at least one assignment pairing being further based at least in part on one or more of the plurality of factors.

4. The system of claim 1, wherein determining the at least one assignment pairing comprises:
   determining the plurality of potential assignments matching the plurality of autonomous robots with the plurality of missions;
   assigning the respective assignment score to individual potential assignments of the plurality of potential assignments; and
   ranking the assignment scores based at least in part on the respective assignment score associated with the individual potential assignments.

5. A system, comprising:
   at least one computing device; and
   at least one application executable in the at least one computing device, wherein when executed the at least one application causes the at least one computing device to at least:
   identify an autonomous robot designed to perform a type of material handling task in a material handling facility;
   obtain mission data associated with individual missions of a plurality of missions corresponding to the type of material handling task that can be performed by the autonomous robot, the mission data comprising at least one of a mission priority, a mission length, or a mission location;

estimate a respective mission completion time for the individual missions based at least in part on a respective estimated robot speed, a deceleration capability, a load time, an unload time, a mission length, a load weight, an estimated quantity of passing events, an estimated quantity of stop events for individual missions and historical data defining one or more congestion areas within the material handling facility, wherein the respective estimated robot speed is based at least in part on:
   a load weight associated with an individual mission,
   an estimation of a path that the autonomous robot will take during performance of the individual mission, and
   an aisle width of one or more of a plurality of aisles within the material handling facility;
select a particular mission from the plurality of missions based at least in part on a ranking of respective assignment scores assigned to a plurality of potential assignment pairings of the autonomous robot and the individual missions, a respective assignment score being based at least in part on the respective mission completion time and a plurality of factors derived from the mission data, historical data associated with characteristics of the material handling facility, and robot data, the robot data comprising a battery charge state and a battery health of the autonomous robot; and
instruct the autonomous robot to perform the particular mission.

6. The system of claim 5, wherein the material handling facility comprises an unstructured environment for navigation of the autonomous robot.

7. The system of claim 5, wherein the robot data further comprises at least one of a location of the autonomous robot within the material handling facility, a robot task capability, a robot task status, or a robot battery health.

8. The system of claim 7, wherein, when executed, the at least one application further causes the at least one computing device to at least obtain the robot data from the autonomous robot.

9. The system of claim 5, wherein the particular mission is further selected according to the plurality of factors comprising at least one of a load time, an unload time, a number of passing events, a number of stop events, a deceleration capability, or a robot speed.

10. The system of claim 9, wherein, when executed, the at least one application further causes the at least one computing device to at least:
   generate a respective assignment score for individual missions of the plurality of missions based at least in part on the respective mission completion time, the plurality of factors, and the battery charge state of the autonomous robot; and
   rank a plurality of assignment scores based at least in part on the respective assignment score for the individual missions.

11. The system of claim 9, wherein, when executed, the at least one application further causes the at least one computing device to at least estimate one or more factors of the plurality of factors based at least in part on the robot data and the mission data.

12. The system of claim 11, wherein selecting the particular mission for the autonomous robot to perform is further based at least in part on the historical data associated with one or more characteristics of the material handling facility.

13. The system of claim 5, wherein the particular mission is selected to optimize robot utilization of the autonomous robot.

14. A method, comprising:
identifying, by at least one computing device, a mission to be performed within an unstructured material handling facility;
selecting, by the at least one computing device, a subset of autonomous robots in the unstructured material handling facility that can perform the mission based at least in part on a mission location of the mission;
obtaining, by the at least one computing device, robot data associated with individual autonomous robots of the subset of autonomous robots, the robot data comprising a battery charge state and battery health of the individual autonomous robots;
for the individual autonomous robots, estimate a respective mission completion time for the mission based at least in part on a respective estimated robot speed, a deceleration capability, a load time, an unload time, a mission length, a load weight, an estimated quantity of passing events, an estimated quantity of stop events, and historical data defining one or more congestion areas within the material handling facility, wherein the respective estimated robot speed is based at least in part on:
   a load weight associated with an individual mission,
   an estimation of a path that the autonomous robot will take during performance of the individual mission, and
   an aisle width of one or more of a plurality of aisles within the material handling facility;
selecting, by the at least one computing device, a particular autonomous robot from the subset of autonomous robots based at least in part on a ranking of assignment scores assigned to a plurality of potential assignment pairings of the mission and the individual autonomous robots, a respective assignment score for individual potential assignment pairings being based at least in part on the respective mission completion time, historical data associated with characteristics of the material handling facility, and a plurality of factors derived from the robot data and mission data associated with the mission; and
instructing, by the at least one computing device, the particular autonomous robot to perform the mission within the unstructured material handling facility.

15. The method of claim 14, wherein selection of the particular autonomous robot to perform the mission is based at least in part on optimizing robot utilization of the particular autonomous robot.

16. The method of claim 14, wherein selecting the particular autonomous robot further comprises at least:
   for individual potential assignment pairings comprising the mission and the individual autonomous robots of the subset of autonomous robots:
      determining the plurality of factors based at least in part on the robot data and the mission data;
      assigning a respective weight to individual factors of the plurality of factors; and
      generating the respective assignment score based at least in part on a sum of weights assigned to the individual factors, and
   wherein the particular autonomous robot is selected based at least in part on the score meeting or exceeding a predefined threshold.

17. The method of claim 16, wherein the plurality of factors comprise at least one of a mission length, a load time, an unload time, a number of passing events, a number of stop events, a deceleration capability, or the estimated robot speed.

18. The method of claim 14, wherein the robot data further comprises at least one of a location of the particular autonomous robot within the unstructured material handling facility, the battery charge state, a robot task capability, a robot task status, or a robot battery health.

19. The method of claim 14, wherein the particular autonomous robot is selected from the subset of autonomous robots based at least in part on learned congestion data associated with one or more areas of the unstructured material handling facility that are associated with the mission.

20. The method of claim 14, wherein the mission comprises moving an object from a first location to a second location, and estimating the respective mission completion time is further based at least in part on the first location, the second location, and the mission data.

* * * * *